United States Patent
Yakymyshyn et al.

(10) Patent No.: US 7,279,884 B2
(45) Date of Patent: *Oct. 9, 2007

(54) TEMPERATURE COMPENSATED AND SELF-CALIBRATED CURRENT SENSOR USING REFERENCE MAGNETIC FIELD

(75) Inventors: Christopher Paul Yakymyshyn, Seminole, FL (US); Michael Allen Brubaker, Loveland, CO (US); Pamela Jane Yakymyshyn, Seminole, FL (US)

(73) Assignee: Field Metrics, Inc, Seminole, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/556,932

(22) Filed: Nov. 6, 2006

(65) Prior Publication Data

US 2007/0057662 A1    Mar. 15, 2007

Related U.S. Application Data

(62) Division of application No. 10/905,509, filed on Jan. 7, 2005, now Pat. No. 7,164,263.

(60) Provisional application No. 60/481,906, filed on Jan. 16, 2004.

(51) Int. Cl.
   *G01F 23/00*    (2006.01)
(52) U.S. Cl. .............................. 324/117 R; 324/117 H; 324/126
(58) Field of Classification Search ..... 324/117 R–117 H, 126–127, 250–252
   See application file for complete search history.

(56) References Cited

U.S. PATENT DOCUMENTS

| | | | |
|---|---|---|---|
| 3,323,057 A | 5/1967 | Haley | |
| 4,327,416 A | 4/1982 | Jerrim | |
| 4,558,276 A | 12/1985 | Comeau et al. | |
| 4,559,495 A | 12/1985 | Lienhard | |
| 4,625,166 A | 11/1986 | Steingroever et al. | |
| 4,709,205 A | 11/1987 | Baurand et al. | |
| 4,823,075 A | 4/1989 | Alley | |
| 4,841,235 A | 6/1989 | Hastings et al. | |
| 4,857,837 A | 8/1989 | Baran et al. | |
| 4,887,027 A | 12/1989 | Strasser | |
| 4,894,610 A | 1/1990 | Friedl | |
| 5,049,809 A | 9/1991 | Wakatsuki et al. | |
| 5,103,163 A | 4/1992 | McLyman | |
| 5,103,164 A * | 4/1992 | Kawaguchi et al. | 324/117 R |
| 5,124,642 A | 6/1992 | Marx | |
| 5,151,649 A | 9/1992 | Heroux | |
| 5,172,052 A | 12/1992 | Wells | |
| 5,426,360 A | 6/1995 | Maraio et al. | |
| 5,438,257 A | 8/1995 | Berkcan | |
| 5,459,395 A | 10/1995 | Berkcan | |
| 5,463,313 A | 10/1995 | Berkcan | |
| 5,473,244 A | 12/1995 | Libove et al. | |
| 5,493,211 A | 2/1996 | Baker | |
| 5,717,326 A | 2/1998 | Moriwaki | |
| 5,825,175 A | 10/1998 | Selcuk | |
| 6,175,229 B1 | 1/2001 | Becker et al. | |
| 6,215,296 B1 | 4/2001 | Arnoux | |

(Continued)

*Primary Examiner*—Vinh P. Nguyen

(57) ABSTRACT

A method is described to provide temperature compensation and self-calibration of a current sensor based on a plurality of magnetic field sensors positioned around a current carrying conductor. A reference magnetic field generated within the current sensor housing is detected by the magnetic field sensors and is used to correct variations in the output signal due to temperature variations and aging.

12 Claims, 14 Drawing Sheets

U.S. PATENT DOCUMENTS

| | | |
|---|---|---|
| 6,271,656 B1 | 8/2001 | Juds et al. |
| 6,366,076 B1 | 4/2002 | Karrer et al. |
| 6,472,878 B1 | 10/2002 | Bruchmann |
| 6,531,862 B1 | 3/2003 | Stanley |
| 6,545,456 B1 | 4/2003 | Radosevich et al. |
| 6,555,999 B1 | 4/2003 | Lindsey et al. |
| 6,717,397 B2 | 4/2004 | Sorenson, Jr. |
| 6,759,840 B2 | 7/2004 | Marasch et al. |
| 6,781,359 B2 | 8/2004 | Stauth et al. |
| 6,825,650 B1 | 11/2004 | McCormack et al. |

* cited by examiner

TEMPERATURE COMPENSATED AND SELF-CALIBRATED CURRENT SENSOR USING REFERENCE MAGNETIC FIELD

CROSS REFERENCE TO PRIOR APPLICATION

This application is a divisional of U.S. application Ser. No. 10/905,509 filed Jan. 7, 2005, now U.S. Pat. No. 7,164,263, and entitled "Current Sensor," which claims the priority of U.S. Provisional Application Ser. No. 60/481,906 filed Jan. 16, 2004 and entitled "CURRENT SENSOR". The subject matter of U.S. application Ser. No. 10/905,509 (now U.S. Pat No. 7,164,263) and U.S. Provisional Application Ser. No. 60/481,906 are incorporated herein by reference.

FEDERAL GOVERNMENT STATEMENT

This invention was made with Government support under contract DE-FG03-01 ER83228 awarded by the Department of Energy. The Government has certain rights to this invention.

FIELD OF THE INVENTION

The present invention relates to a clamp-on current sensor for measuring alternating and direct electrical current such as the current of a high-voltage power transmission line or a substation bus conductor.

DESCRIPTION OF THE PRIOR ART

A variety of current measurement techniques are known in the art, including current transformers, Rogowski coil transformers, resistive shunts in series or in parallel with a current-carrying conductor, magnetic field point sensors, magnetic field line integral sensors, and line integral optical current sensors.

Current transformers consist of two or more windings, each winding consisting of one or more turns of wire, around a continuous core having a high magnetic permeability to concentrate the magnetic flux lines generated by current flowing in the windings. The ratio of turns in the windings determines the turns ratio of the transformer. Clamp-on current transformers introduce a break in the core to permit its installation around a current carrying conductor without breaking the conductor. Current transformers only respond to AC currents unless special steps are taken to actively switch the magnetization direction or strength in the core. Furthermore, at high voltages found in power transmission systems, current transformers become extremely large and heavy and contain insulating mineral oil in order to satisfy the dielectric requirements of the application.

A Rogowski coil consists of a coil winding placed around a core having a magnetic permeability similar to air. A current-carrying conductor is passed through the coil, and generates an output voltage that is proportional to the time derivative of the current in the conductor. The real-time current can be estimated by time-integrating the signal from the Rogowski coil. Rogoswki coils require an AC current to generate an output signal, and their output amplitude is proportional to the frequency of the current.

A resistive shunt consists of a resistor connected to a current-carrying conductor in such a manner as to allow at least some of the conductor current to pass through the resistive element. The resulting voltage drop across the resistive element is a measure of the current flowing through the element. The resistive element can be placed in series with the current-carrying conductor, whereby all the conductor current passes through the resistive element, or it can be placed in parallel with a portion of the current-carrying conductor, whereby it shunts a known portion of the current away from the conductor. Resistive current sensors can measure AC or DC currents, and are relatively easy to use when the currents to be measured are small, i.e. less than 100 Amperes.

Field sensors take advantage of the magnetic field generated by the current in a conductor. By placing a point magnetic field sensor near the conductor, the sensor output signal is proportional to the current in the conductor. By using a magnetic field sensor of the proper type, this current sensor can respond to AC or DC currents, and can have a wide frequency response. Calibration is difficult to achieve or maintain with this approach. Stray magnetic fields generated by other currents located nearby will also cause measurement errors.

Optical current sensors use the Faraday effect in an optical solid to change the travel time, polarization state or optical phase of an optical signal, in direct proportion to the magnetic field present along the optical path. By creating a closed optical path that encircles a current carrying conductor, the resulting signal is proportional to the current, and is substantially immune to interfering magnetic fields from other conductors, the position of the conductor relative to the sensor structure, and the size of the conductor. The sensor can be made to respond to DC or AC currents, and it can have a high bandwidth. Optical current sensors are difficult to design as a clamp-on device, and they suffer from high costs.

The most accurate current sensors take advantage of Ampere's law, which states that the line integral of the magnetic field along a closed path encircling a current is proportional to the current. More importantly, the integral is not sensitive to the details of the path shape, the spatial distribution of the current within the closed integration path, or the presence of any currents that do not pass through the closed integration path. The current transformer achieves this by having a closed path of high permeability core. The Rogowski coil achieves this by having a coil encircling the conductor with uniform turns per inch along the winding. The optical current sensor achieves this by having an optical sensor element encircling the conductor, such as a block of glass through which a hole has been machined to allow a conductor to pass through and in which the optical beam propagates in a closed path encircling the hole, or an optical fiber that carries the optical signal and can be formed into a closed loop or loops around the current carrying conductor.

Current sensors that rely on one or two point magnetic field sensors do not approach a good approximation of Ampere's law, and are therefore prone to inaccuracies due to the presence of external magnetic fields and the position of the conductor relative to the sensor(s).

Baker discloses in U.S. Pat. No. 5,493,211, issued Feb. 20, 1996, a current probe using a Hall sensor that can be calibrated by using a switched coil to introduce a known current into the conductor under test and measuring the response of the Hall sensor. The response can be used to calibrate the Hall sensor output in response to currents in the conductor under test. This method requires the induction of a test current into the conductor being monitored, which may be difficult when high currents are being measured on a power line. Berkcan discloses in U.S. Pat. No. 5,459,395 issued Oct. 17, 1995, and U.S. Pat. No. 5,438,257 issued Aug. 1, 1995, a method of using a coil to generate a magnetic field that is sensed by two point magnetic field sensors, or two line integrating magnetic field sensors, to create a calibration of the ratio of the responses from the pair of sensors. The ratio is then used to calibrate the response of the sensor pair to the magnetic field generated by the current flowing through the conductor under test. This method suffers from being sensitive to stray magnetic fields in the vicinity of the conductor under test, resulting in erroneous readings from the sensor pair.

Several attempts have been made to provide separate point sensors to compensate for the presence of external magnetic fields not generated by the current in the conductor of interest. Marx disclosed in U.S. Pat. No. 5,124,642 issued Jun. 23, 1992 the use of two coil sensors placed on opposing sides of a current carrying conductor to measure the current. The two coils are oppositely polarized, and the two signals are differenced to provide a signal that is substantially proportional to the time derivative of the current in the conductor, and less sensitive to stray magnetic fields. Friedl discloses in U.S. Pat. No. 4,894,610 issued Jan. 16, 1990, the use of two or more coil sensors to measure the current in a conductor while reducing the errors caused by stray magnetic fields. Arnoux et al. disclose in U.S. Pat. No. 6,215,296 issued Apr. 10, 2001 the use of two point magnetic field sensors to measure the current in a conductor, with one sensor being shielded or otherwise located to provide compensation for external stray magnetic fields. Lienhard discloses in U.S. Pat. No. 4,559,495, issued Dec. 17, 1985, the use of two sensors located near a conductor to measure the current carried by the conductor. All of the disclosed techniques are attempts to approximate Ampere's law with two sensors. This approach does not eliminate errors due to stray magnetic fields, and requires careful geometric stability of the sensor locations to maintain calibration.

Berkcan discloses in U.S. Pat. No. 5,438,257 issued Aug. 1, 1995 and U.S. Pat. No. 5,463,313 issued Oct. 31, 1995, the use of two point sensors or two line integral sensors to measure the current in a conductor. The sensors are mounted near the conductor, and the ratio response of the two sensors to the conductor current is calibrated during construction. A separate coil is also disclosed that is driven by an adjustable current to reduce or null the magnetic field at the sensors. Other than reducing the magnetic flux at the sensors, there is no clear advantage of this approach.

Hall or Magneto-resistive sensors have been coupled with a core having a high magnetic permeability to focus the magnetic flux lines through the sensor. Marasch et al. in U.S. Pat. No. 6,759,840 issued Jul. 6, 2004, Becker et al. in U.S. Pat. No. 6,175,229 issued Jan. 16, 2001, McLyman in U.S. Pat. No. 5,103,163 issued Apr. 7, 1992, Radosevich et al. in U.S. Pat. No. 6,545,456 issued Apr. 8, 2003, Baran et al. in U.S. Pat. No. 4,857,837 issued Aug. 15, 1989, Comeau et al. in U.S. Pat. No. 4,558,276 issued Dec. 10, 1985, all disclose methods of this type. However, these methods suffer from measurement errors due to magnetic saturation of the core material, hysteresis effects in the core material, temperature dependent magnetic permeability of the core material, and non-linearity of the core material. In addition, the methods are only applicable to the measurement of AC currents. Hastings et al. discloses in U.S. Pat. No. 4,841,235, issued Jun. 20, 1989, the use of spaced pole pieces with magneto-resistive sensors placed between the pole pieces, and flux shunting pieces between adjacent pole pieces to shunt excessive flux from the sensors and prevent sensor damage. The pole pieces and shunting pieces also provide magnetic shielding for the sensors from stray magnetic fields. This approach suffers from errors due to high permeability materials being present near the sensors, incomplete shielding from stray magnetic fields, and rigid geometric alignment required to maintain calibration.

Karrer et al. disclose in U.S. Pat. No. 6,366,076 issued Apr. 2, 2002, the use of a Rogowski coil together with a magnetic field point sensor such as a Hall sensor to create a current sensor with a wide bandwidth capability. The point sensor is used to measure DC and low frequency currents, while the Rogowski coil provides sensitive measurements of high frequency currents. However, this approach does not address errors caused by stray magnetic fields, and it is generally difficult to seamlessly combine signals covering different frequency ranges.

Several methods have been disclosed to measure current using a number of point sensors arranged around a current carrying conductor. Moriwaki discloses in U.S. Pat. No. 5,717,326 issued Feb. 10, 1998 the use of two or four coil or Hall sensors situated around a current carrying conductor to measure the current in the conductor, with half of the sensors oriented with opposing polarity, and the opposing polarity signals amplified by a difference amplifier to substantially reduce stray magnetic field effects. However, the efficacy of the method is not disclosed, as no mention of Ampere's law is referred to when determining the positions of the sensors relative to the conductor, and the device is does not clamp on to the conductor. McCormack et al. disclose in U.S. Pat. No. 6,825,650 issued Nov. 30, 2004, the use of more than one Rogowski coils spaced around a circular path the encircles the current carrying conductor, with the gap between adjacent coils allowing the passing through of the current carrying conductor. Also, two concentric rings of coils are disclosed to reduce the effects of stray magnetic fields. The two concentric rings do not provide effective cancellation of errors due to stray magnetic fields, and no mention of approximating Ampere's law is made in the disclosed method. Wakatsuki et al. disclose in U.S. Pat. No. 5,049,809 issued Sep. 17, 1991 the use of a plurality of magneto-resistive elements connected in series that are disposed on a circular path centered on the conductor and encircling the current carrying conductor. The method relies on the use of magneto-resistive elements, which are nonlinear, saturate and damage easily in high magnetic fields, and have large temperature sensitivities. Baurand et al. disclose in U.S. Pat. No. 4,709,205 issued Nov. 24, 1987, the use of a plurality of series-connected air-core coils located on a polygon encircling a current carrying conductor. The method is limited to measuring AC currents. Sorenson, Jr. discloses in U.S. Pat. No. 6,717,397 issued Apr. 6, 2004, the use of two sets of series connected coils positioned on two circular paths of differing radii and centered on a current carrying conductor. The two sets of coils provide a difference signal that can be used to reduce the errors caused by stray magnetic fields. The method does not eliminate errors due to stray magnetic fields, and is limited to the measurement of AC currents.

Stanley discloses in U.S. Pat. No. 6,531,862 issued Mar. 11, 2003, the use of multiple current sensors to measure the current in a conductor, by separating the total current into individual sub-conductors, each of which is measured with a current sensor such as a closed loop Hall current sensor. The sensor signals are summed to give the desired total signal. Since the noise associated with each current sensor is uncorrelated, the signal to noise ratio of the summed signal improves as the square root of the number of current sensors used. This approach is unnecessarily complicated.

Stauth, et al. disclose in U.S. Pat. No. 6,781,359 issued Aug. 24, 2004, an assembly consisting of a Hall effect sensor, a magnetic core and an electrical conductor. The Hall sensor and the core are located near a notch in the conductor. The method suffers from magnetic saturation of the core material, hysteresis effects in the core material, temperature dependent magnetic permeability of the core material, and nonlinearity of the core material all causing measurement errors. In addition, the method is only applicable to the measurement of AC currents and it does not eliminate errors due to stray magnetic fields. Wells discloses in U.S. Pat. No. 5,172,052, issued Dec. 15, 1992, the use of a Hall sensor to measure current in a conductor by locating the sensor near the conductor. Juds et al. disclose in U.S. Pat. No. 6,271,656 issued Aug. 7, 2001, the use of a Hall sensor positioned next to a conductor to measure current. Lindsey et al. discloses in U.S. Pat. No. 6,555,999, issued Apr. 29, 2003, the use of a point magnetic field sensor placed within an insulating column. Bruchmann discloses in U.S. Pat. No. 6,472,878 issued Oct. 29, 2002 the use of a U-shaped conductor with the Hall sensor placed in close proximity with the conductor to double the magnetic field at the sensor. The methods do not account for, or eliminate, errors caused by stray magnetic fields, conductor size, conductor position or current distribution over the cross-section of the conductor. Alley discloses in U.S. Pat. No. 4,823,075, issued Apr. 18, 1989, the use of a Hall sensor placed in a null coil to measure current in a nearby current carrying conductor. The current in the null coil is adjusted to cancel the magnetic field measured by the Hall sensor, resulting in a null coil current that is proportional to the conductor current. The method does not account for errors caused by stray magnetic fields.

Selcuk discloses in U.S. Pat. No. 5,825,175, issued Oct. 20, 1998 the use of more than one point magnetic field sensor placed in each of two high magnetic permeability arms that can be clamped around a current carrying conductor. A nulling coil placed around each arm is driven by an adjustable current to null the magnetic field at each sensor element. The adjustable current is a measure of the current in the conductor. The arms also shield the point sensors from stray magnetic fields. This method suffers from the disadvantages of the errors attributed to a high permeability material near the sensors, incomplete elimination of errors from stray magnetic fields, and additional errors caused by imperfect mating of the surfaces of the two arms, causing incomplete flux capture.

Temperature compensation of a Hall sensor using a Read only memory lookup table is disclosed by jerrim in U.S. Pat. No. 4,327,416, issued Apr. 27, 1982. The method uses a lookup table generated by a temperature calibration run to provide temperature compensation for the Hall sensor.

Clamp-on and slipover current sensors have been previously disclosed and are well known in the art. For example, Maraio, et al. discloses in U.S. Pat. No. 5,426,360 issued Jun. 20, 1995 the use of a split core of high permeability material to form a current transformer that can be fastened around a conductor without breaking the conductor. This approach suffers from saturation of the core at high currents, and errors caused by imperfect contact between the ends of the two halves of the core. The reluctance of the magnetic circuit is dominated by the air gaps between the halves and repeatable performance is difficult to achieve. Edwards discloses in U.S. Pat. No. 5,057,769, issued Oct. 15, 1991, the use of a C-shaped main coil and a pair of compensating coils at the open ends of the main coil to compensate for the opening in the main coil. This method does not compensate for strong stray magnetic fields, and requires an integration of the output signal to represent the current in the conductor. In addition, the calibration factor depends on the conductor size and its position in the C-shaped main coil.

Several disclosures address current sensors located far from the current carrying conductor. Heroux discloses in U.S. Pat. No. 5,151,649 issued in Sep. 29, 1992, the use of two sets of triaxial sensor coils to measure estimate the current in a conductor far removed from the sensing array. Strasser discloses in U.S. Pat. No. 4,887,027 issued on Dec. 12, 1989, the use of multiple magnetic field sensors to calculate the current in a conductor situated a distance away from the sensors. These methods assume that the conductor generates the dominant magnetic field at the sensor array, the geometry is assumed to be well known and unchanging, and ferrous materials are assumed not be in the vicinity of the sensors or the conductor. These assumptions lead to large errors in practical applications.

The power utility industry measures current and voltage to calculate power flow and energy transferred between suppliers and customers. There are several standards defined by the Institute for Electrical and Electronics Engineers (IEEE) and the International Electricity Committee (IEC) that determine the magnitude and phase angle accuracy requirements for devices used to measure current when used for revenue metering or system protection. For example, ANSI/IEEE Standard C57.13 requires that a current transformer must have an amplitude error of no greater than +/−0.3% and a phase angle error of no greater than +/−1.5 minutes of arc over a wide range of currents, regardless of temperature, stray magnetic fields, conductor size or installation environment. IEC Standard 100044-7 has a similar current transformer requirement of +/−0.2% magnitude error and +/−10 minutes of arc in phase angle error. The only current sensors that can meet these requirements must either replicate or closely mimic Ampere's law. The prior art current sensors mentioned above that use one or a few point magnetic field sensors cannot meet these stringent accuracy requirements, and generally have magnitude accuracies that fall in the range of 1% - 20%. Magnetic field sensors such as Hall sensors and Magneto-resistive sensors are notoriously inaccurate in conditions as wide-ranging as −50 degrees C. to +85 degrees C., time spans of a decade, large fault currents of >100,000 Amperes, or when subjected to mechanical stress.

There exists a need for a current sensor that can meet the accuracy requirements for revenue metering in power utility applications, is lightweight, low cost, has a bandwidth from DC to >10 kiloHertz, and can be clamped in place without having to disconnect the conductor being monitored.

SUMMARY OF THE PRESENT INVENTION

Briefly, a current sensor for applications including but not limited to DC, 50 Hz and 60 Hz power lines (or substation bus conductors) is described that consists of a plurality of magnetic field sensors oriented and located around a current carrying conductor. The magnetic field sensors are preferably Hall effect sensors, although a variety of other magnetic field sensors can be substituted. The sensors are attached to two printed circuit boards that are placed in two protective housings. The two housings are hinged together, allowing the two housings to close around a continuous conductor without breaking the conductor at either end. The magnetic field sensors are selected to be sensitive to one vector component of the magnetic field, and the sensitivity axis of each sensor is oriented to be tangential to a circle circumscribing, and approximately centered on, the current carrying conductor. As such, the sensors monitor the azimuthal component of the magnetic field, which is directly related to the conductor current. The number of sensors is selected to provide an accurate approximation to Ampere's law. The magnetic field sensor outputs are combined in a summing amplifier. The output of the summing amplifier is passed through a filter circuit to compensate for time delays in the magnetic field sensors and the amplifier. The filter output passes through a second amplifier to provide a desired amplitude gain, resulting in an output voltage or current that is substantially proportional to the current in the current carrying conductor. Additional circuitry is disclosed that adjusts the output signal from the magnetic field sensors to make the output signal substantially immune to changes in temperature.

One advantage of the present invention is that it is very low in weight.

Another advantage of the present invention is that revenue accuracy measurements can be achieved for power system applications.

Another advantage of the present invention is that relaying accuracy measurements can be achieved for power system applications.

Another advantage of the present invention is that low cost components are used for its fabrication, resulting in a low total sensor cost.

Another advantage of the present invention is that high accuracy is independent of conductor position within the sensor window.

Another advantage of the present invention is that high accuracy is independent of conductor tilt relative to the sensor housing.

Another advantage of the present invention is that high accuracy is maintained over a wide operating temperature range as large as −50 degrees C. to +85 degrees C.

Another advantage of the present invention is that high accuracy is independent of the rotation angle of the housing.

Another advantage of the present invention is that high accuracy is independent of stray magnetic fields generated by current carrying conductors located nearby.

Another advantage of the present invention is that high accuracy is independent of the application of mechanical shocks to the sensor housing.

Another advantage of the present invention is that high accuracy is maintained because no magnetic core is included in the sensor design.

Another advantage of the present invention is that the sensor can provide high accuracy measurements of direct currents as well as alternating currents.

Another advantage of the present invention is that the sensor can provide high accuracy measurements of alternating currents having frequencies up to 100 kHz.

Another advantage of the present invention is that high accuracy can be maintained after extreme temperature excursions as high as 175 degrees C.

Another advantage of the present invention is that high accuracy is maintained during and after exposure to high currents, since there is no magnetic core to saturate or damage.

Another advantage of the present invention is that the design lends itself to simple manufacturing techniques.

Another advantage of the present invention is that the sensor can be clamped onto a conductor, and maintains high accuracy without requiring precise mating of the clamping members.

Another advantage of the present invention is that multiple sensor arrays can be located in the same housing to provide multiple output signals each of which has a different output ratio compared with the current being measured.

Another advantage of the present invention is that no shielding of the sensors from stray magnetic fields is required, since the sensor makes a close approximation to Ampere's law.

Another advantage of the present invention is that the signal to noise ratio of the sensor output is greater than the signal to noise ratio of the each sensor element, since the signals add together linearly with the number of sensors, but the noise component, being uncorrelated between sensors, adds as the square root of the number of sensors.

DETAILED DESCRIPTION OF THE PREFERRED EMBODIMENTS

Figure 1A:
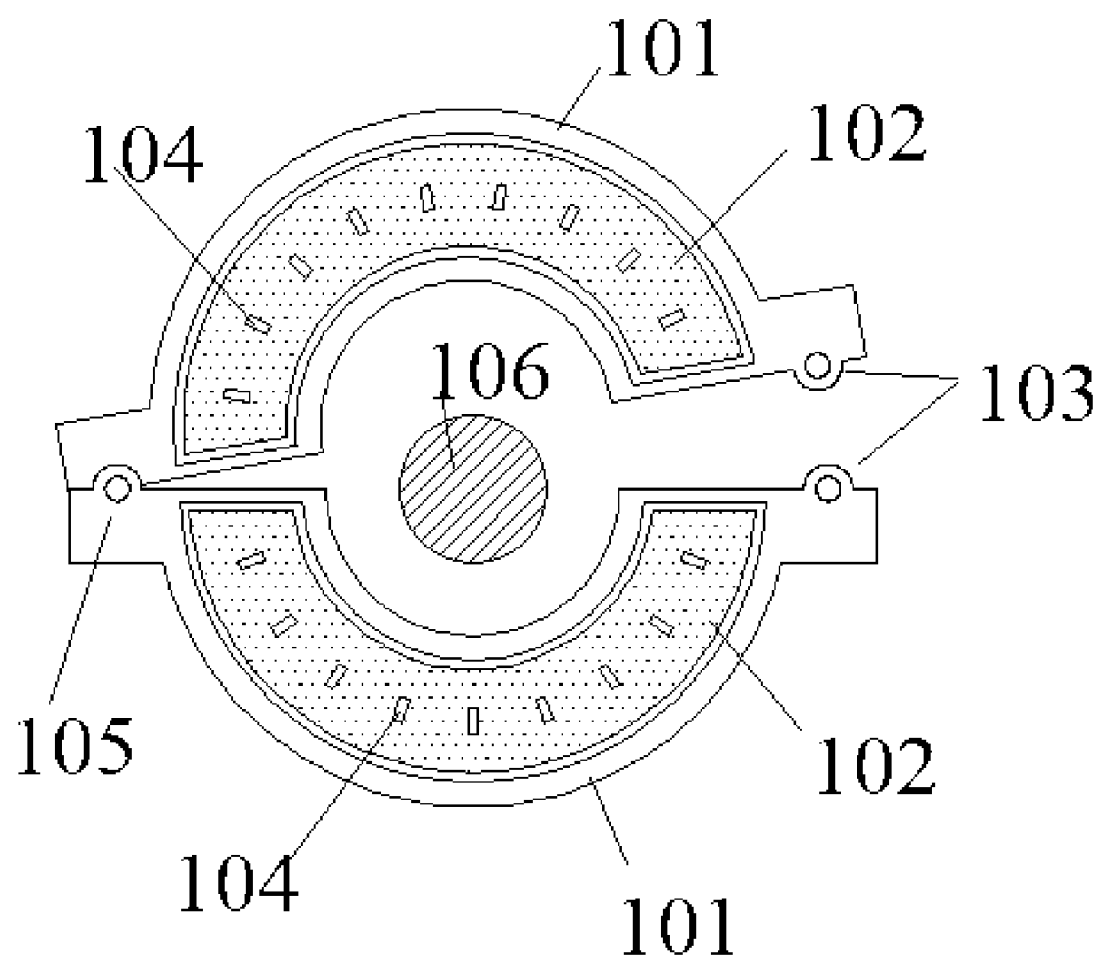
FIG. 1A is a drawing of the current sensor.
Figure 1B:
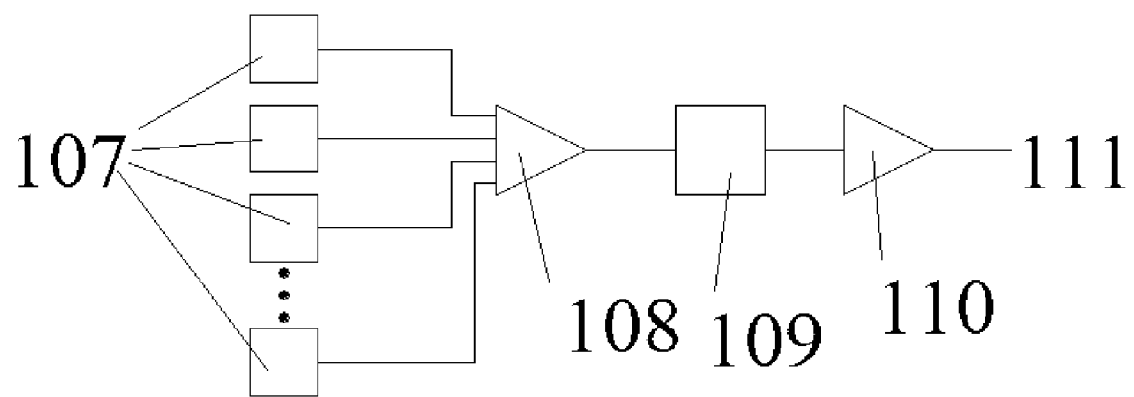
FIG. 1B is a block diagram of the current sensor electronic circuit.

A current sensor for applications including but not limited to DC, 50 Hz and 60 Hz power lines is described that consists of a plurality of magnetic field sensors oriented and located around a current carrying conductor. The magnetic field sensors are preferably Hall effect sensors, although a variety of other magnetic field sensors can be substituted, including but not limited to magnetoresistive, giant magnetoresistive, or magnetostrictive sensors. The current sensor is shown in FIGS. 1A and 1B. Two printed circuit boards 102 are placed in two protective, hermetically sealed housings 101 and arranged to form a closed path around a current carrying conductor 106. The housings are hinged together at hinge 105, allowing the two housings 101 to close around a continuous conductor without breaking the conductor at either end. The two housings are locked together with a fastener at 103. A plurality of magnetic field sensors 104 are placed on each printed circuit board. Wiring provides electrical connections between the two printed circuit boards. The magnetic field sensors 104 are selected to be sensitive to one vector component of the magnetic field, and the sensitivity axis of each sensor is oriented to be tangential to a circle circumscribing, and approximately centered on, the current carrying conductor. The sensors are equally spaced along the circumference of the above-mentioned circle. As such, the sensors monitor the azimuthal component of the magnetic field, which is directly related to the conductor current through Ampere's law.

The magnetic field sensor outputs 107 are combined in a summing amplifier 108. The output of the summing amplifier is passed through a filter circuit 109 to compensate for time delays in the magnetic field sensors and the amplifier. The filter is preferentially a low-pass filter with a cutoff frequency set by the upper frequency range desired, in parallel with a high pass filter having a cut-off frequency well above the frequency range of interest for measurements. The low pass filter removes undesired high frequency noise, whereas the high pass filter provides a phase lead compensation for periodic signals to compensate for a phase lag due to a time delay in the magnetic field sensors. The filter output passes through a second amplifier 110 to provide a desired amplitude gain, resulting in an output voltage or current at 111 that is substantially proportional to the current in the current carrying conductor.

Figure 2:
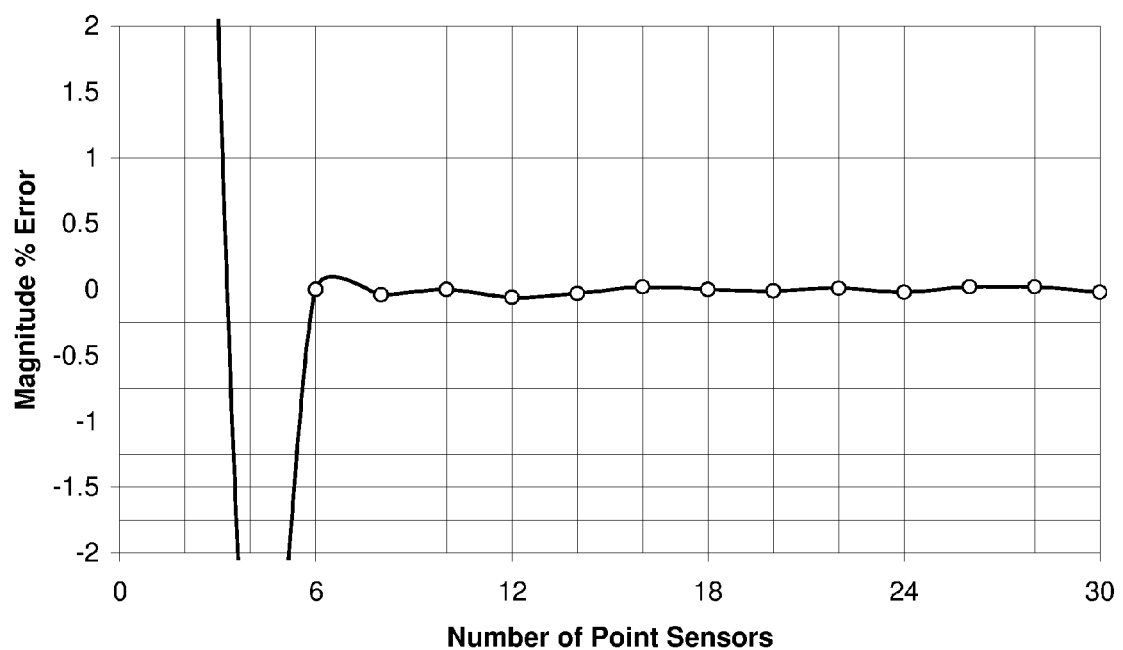
FIG. 2 is a plot of the measurement error versus the number of sensor elements used in the design.

The total number of sensors and the spacing between the sensors along the sensing path is determined by the accuracy required and the proximity of other magnetic fields or materials with high magnetic permeability. Computer modeling is used to calculate the expected error in the magnitude ratio and phase angle of the output signal, when the sensor is located near a second current carrying conductor, near a metallic object having a large magnetic permeability, or when the encircled current carrying conductor is not centered in the sensor housings, or is not collinear with the central axis of the housings. Limits in the variations in the sensitivity of each magnetic field sensor are modeled to determine the variation in sensitivity due to stray magnetic fields and due to rotation of the sensor housings around the current carrying conductor. An example of a calculation is shown in FIG. 2, where the error in amplitude measurement is plotted as a function of the number of equally spaced sensor elements 104. The errors are introduced by the presence of a second conductor placed 60 mm away from the current carrying conductor, and carrying a current of 25% in magnitude of the main current. For this particular disturbance case, the number of sensors required to achieve <0.3% errors is at least 6 elements. It is to be appreciated by someone skilled in the art that other perturbation conditions exist, including but not limited to conductor off-centering, conductor tilt, secondary conductor locations and current levels, variations in responsivity of the sensor elements, conductor diameter, and sensor element position along the sensing circle.

In the subsequent FIGS. 3-7, the circuit diagrams detail the circuitry on one of the two printed circuit boards comprising the complete current sensor. It is to be understood that a complete current sensor is comprised of two of the printed circuit boards, with a summing amplifier that adds together the outputs of each printed circuit board to provide a final output signal for the current sensor. This is shown in FIGS. 3-7. Also, the number of magnetic field sensors on each printed circuit board has been selected for illustration purposes to be six. However, someone skilled in the art will recognize that the number of sensors is adjustable to other values, with the precise number depending on the size of the individual magnetic field sensors relative to the size of the overall current sensor housing, the power supply requirements, and the desired immunity to external magnetic fields. It is important to realize that four or fewer magnetic field sensors will not be sufficient for the current sensor to achieve a magnitude accuracy equal to, or less than 0.3% and a phase angle accuracy equal to, or less than 0.1 degrees of phase.

Figure 3:
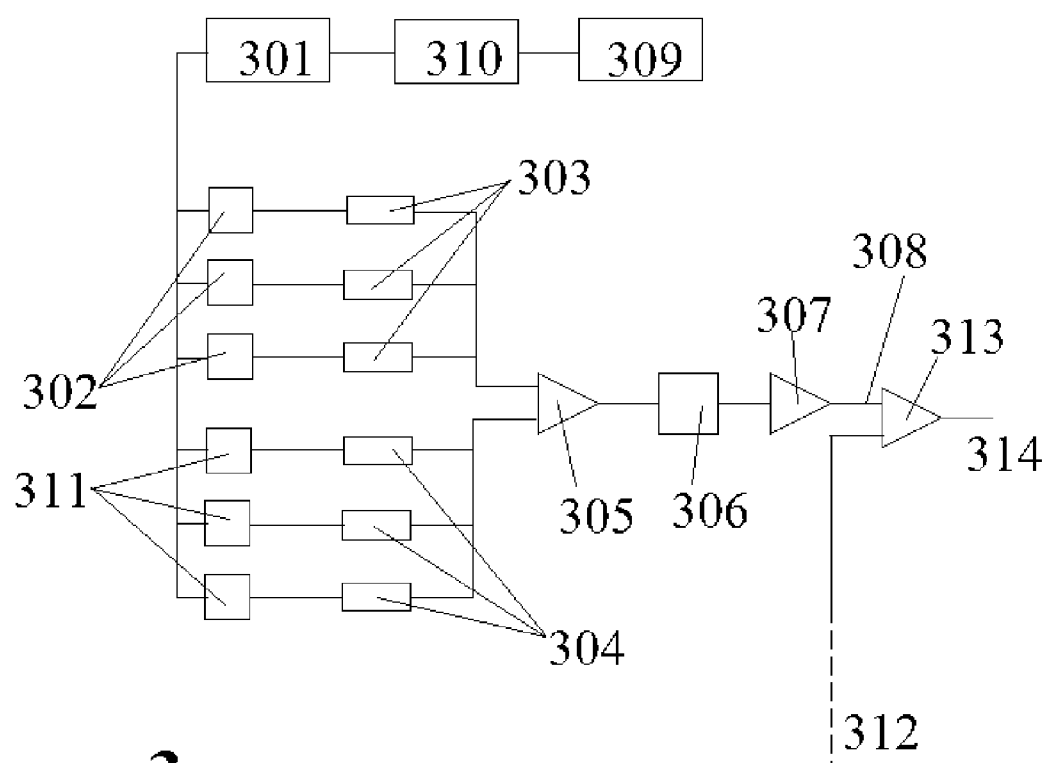
FIG. 3 is a schematic diagram of the temperature compensation circuit using a temperature sensor to adjust the reference voltage.

The magnetic field sensors are electronic integrated circuits with an output signal that is composed of a DC offset voltage that does not depend on magnetic field intensity, superimposed with a second voltage that varies with the magnitude and polarity of the magnetic field created by the electrical current in the conductor (e.g. a 60 Hz sinusoidal signal). To achieve the highest sensitivity, the DC offset voltage must be removed from the output signal. The disclosed method is shown in FIG. 3, which shows the circuitry for one of the two printed circuit boards comprising the current sensor. This is achieved by orienting half of the magnetic field sensors 302 with a positive polarity (that is, the output voltage increases when a magnetic field is generated in the clockwise direction around the current carrying conductor), and half of the magnetic field sensors 311 with the negative polarity (that is, the output voltage increases when a magnetic field is generated in the counter-clockwise direction around the current carrying conductor). The signals from the positive polarity sensors are summed together using impedance elements 303, and the signals from the negative polarity sensors are summed together separately using impedance elements 304. Each summed signal has a DC offset voltage that is the average of the DC offset voltages of the individual magnetic field sensors, and a signal voltage that is proportional to the average magnetic field detected by the magnetic field sensors. Since the same magnetic field sensors are used throughout, the DC offset voltages of the two averaged signals will be effectively equal. The two averaged signals are then differenced in amplifier 305 to create an output signal that has no DC offset voltage, but contains a voltage that is proportional to the average magnetic field seen by all of the magnetic field sensors and thus gives a measure of the current flowing through the conductor. The signal is then passed through a filter 306 and amplifier 307 to generate an output signal 308. A second identical circuit mounted in a second housing provides a second output signal 312 that is substantially in phase with the output 308. The two signals 308 and 312 are summed in summing amplifier 313 to generate an output signal 314 that is substantially in phase with the measured current and proportional in magnitude to the measured current. In this way, very small conductor currents can be amplified to generate an output signal that is easily detected. Furthermore, the output signal has a bandwidth that extends down to DC currents.

All magnetic field sensors have a sensitivity that varies with the ambient temperature, age and mechanical stress. A major challenge for the use of magnetic field sensors to achieve accurate current measurement is to compensate for these variations to create a current sensor with a ratio and phase angle accuracy that is substantially independent of temperature, mechanical stress and age. Several methods to achieve this are described below. In all cases, use is made of the fact that a magnetic field sensor normally provides an output signal that is proportional to the power supply voltage applied to the sensor. This can be used to compensate the sensor output for sensitivity variations over temperature, time and mechanical stress.

A first embodiment of temperature compensation is shown in FIG. 3. The ambient temperature of the printed circuit board is detected by temperature sensor 309 and used to generate a voltage that is proportional to temperature, or a digital number that is proportional to temperature. The error voltage is generated in signal processor 310 using an analog amplifier, or it may be generated by a digital look-up table stored in an electronic memory that is addressed by a number representing the ambient temperature, and provides a digital number that is converted to an analog voltage using a conventional digital-to-analog converter. The error voltage controls a voltage regulator 301 that generates the power supply voltage for all of the magnetic field sensors. As the temperature of the printed wiring board varies, the sensitivity of the magnetic field sensors varies. For example, the output signal may vary by +3% over a temperature change of 100 degrees C. This is compensated by an equal and opposite variation in the power supply voltage of −3% over the temperature range of 100 degrees C., resulting in an output signal that is proportional to the current in the current carrying conductor but substantially unaffected by ambient temperature. Using this technique, the temperature dependence of the output signal can be reduced to 0.2% over a temperature range of 100 degrees C.

Figure 4:
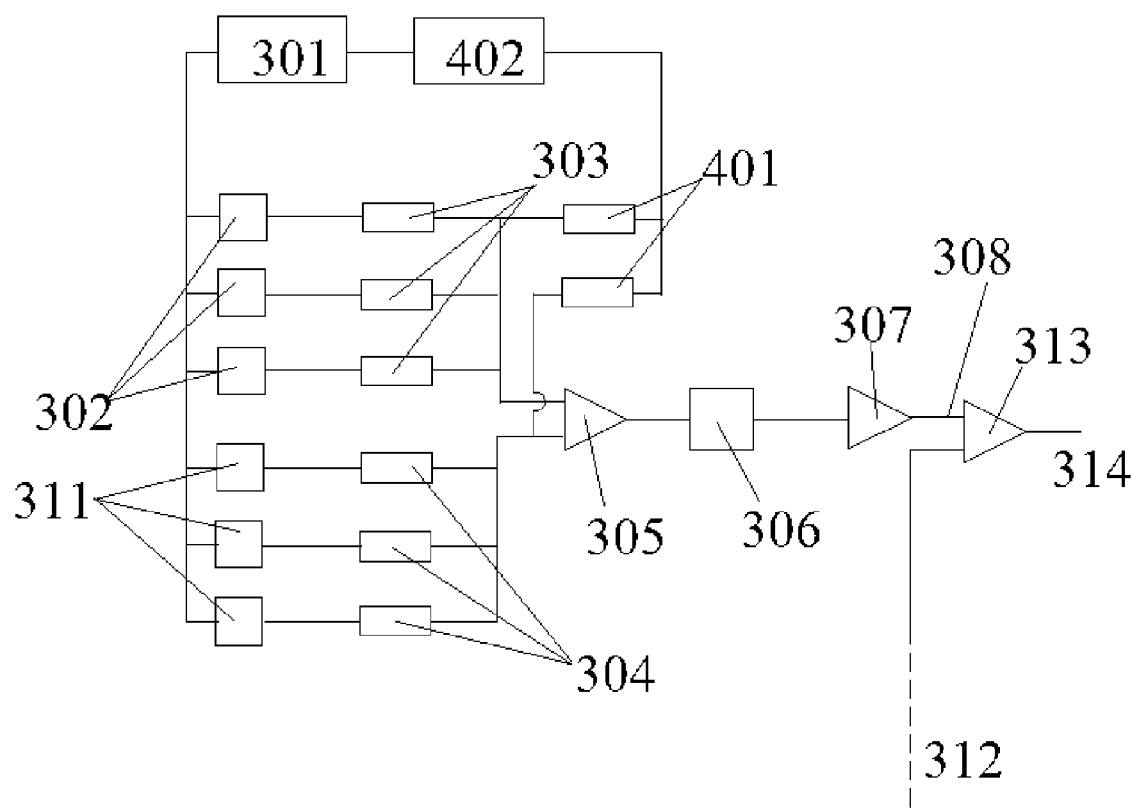
FIG. 4 is a schematic diagram of the temperature compensation circuit using the DC offset of the current sensors to adjust the reference voltage.

In another embodiment of temperature compensation shown in FIG. 4, the DC offset voltage of each magnetic field sensor has a temperature dependence that is similar to the temperature dependence of each sensor's sensitivity to magnetic fields. The DC offset voltages of the positive and negative polarity sensors are monitored using impedance elements 401 to generate a voltage that is the average of the DC offset voltages of all of the magnetic field sensors, but substantially insensitive to conductor current or any stray magnetic fields. This voltage is fed to signal processor 402. The error voltage generated by signal processor 402 may be achieved using an analog amplifier, or it may be generated by a digital look-up table stored in an electronic memory that is addressed by a number representing the DC offset voltage, and provides a digital number that is converted to an analog voltage using a conventional digital-to-analog converter. This voltage controls a voltage regulator 301 that generates the power supply voltage for all of the magnetic field sensors. As the temperature of the printed wiring board varies, the sensitivity of the magnetic field sensors varies. For example, the output signal may vary by +3% over a temperature change of 100 degrees C. The DC offset voltages of the magnetic field sensors also vary by +0.5% over a temperature range of 100 degrees C. The DC offset variation is used to create an equal and opposite variation in the power supply voltage of −3% over the temperature range of 100 degrees C., resulting in a DC offset voltage that maintains a constant value as the ambient temperature is varied. As a result, the output signal is proportional to the current in the current carrying conductor but substantially unaffected by ambient temperature. In this way, the DC offset voltage variations are used to compensate the sensitivity of the magnetic field sensors as the ambient temperature is varied. Note that this method can be used in the presence of DC magnetic fields, because both sensor polarities are used to generate the DC offset voltage. The resulting DC offset voltage is substantially independent of any applied magnetic field.

Figure 5A:
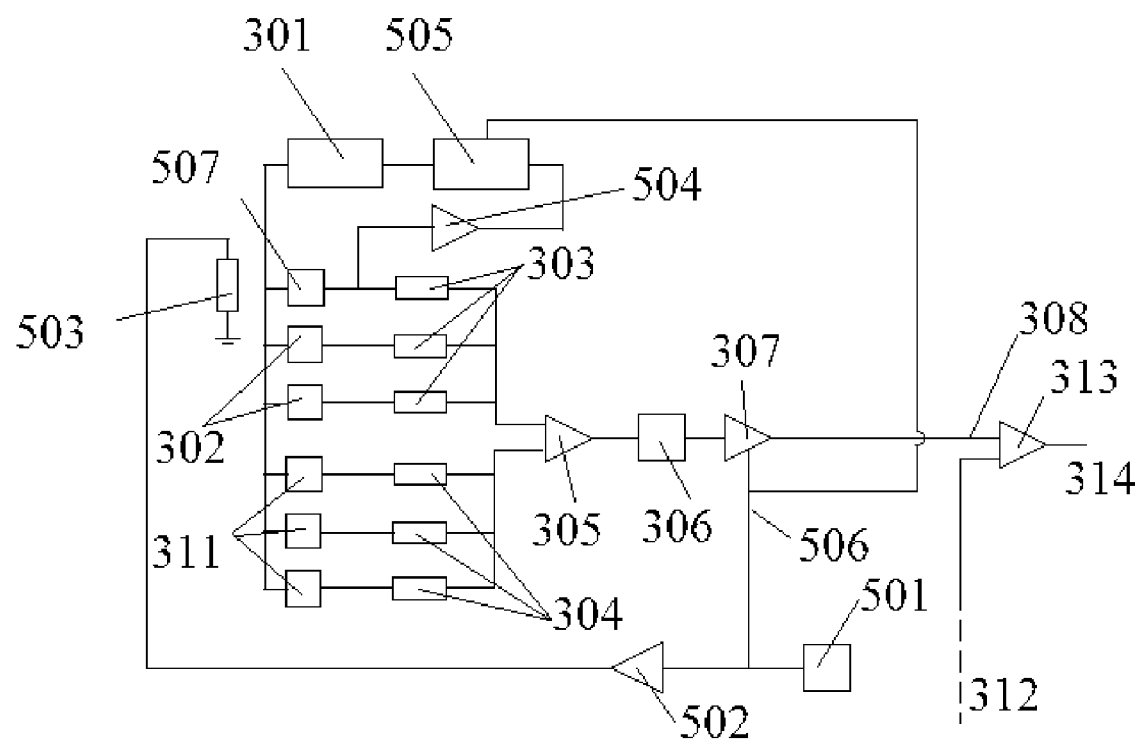
FIG. 5A is a schematic diagram of the temperature compensation circuit using an electromagnet or permanent magnet to generate a signal in one of the current-sensing magnetic field sensors to adjust the reference voltage.
Figure 5B:
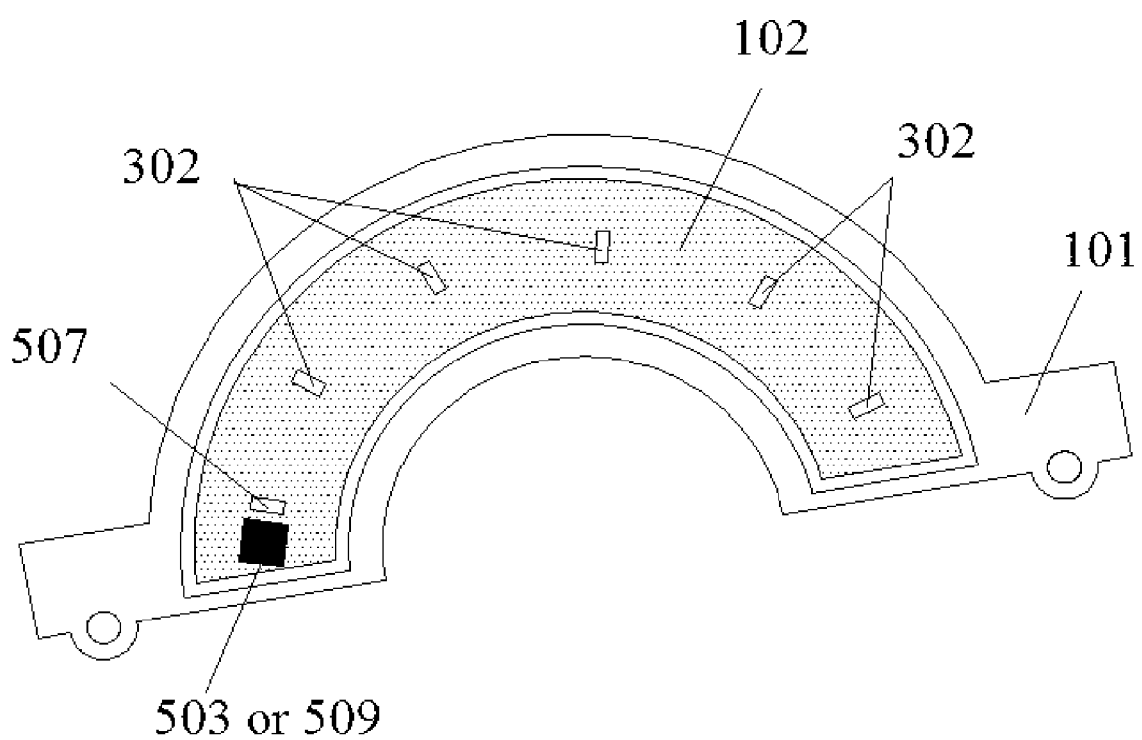
FIG. 5B is a drawing of one half of the current sensor, showing the location of the electromagnet or permanent magnet.

In a third embodiment of temperature compensation shown in FIGS. 5A and 5B, a magnetic field is generated in the vicinity of one or more of the magnetic field sensors. The magnetic field can be a DC field created by a permanent magnet 509 in close proximity to one magnetic field sensor 507, or a DC or AC field generated by an electromagnet such as a solenoid 503. The magnetic field sensor 507 should be selected to have a temperature dependence that is substantially the same as the average temperature dependence of the entire array of magnetic field sensors. If a DC magnetic field is used, then the current sensor can only be used to measure AC currents. If an AC magnetic field is used, then the current sensor can be used to measure DC and AC currents. The magnitude of the extra magnetic field in the region surrounding the magnetic field sensor is kept as stable as possible. For the permanent magnet 509, this is achieved by selecting the permanent magnet material to have thermally stable properties, and includes materials such as Alnico and Samarium-Cobalt. For the solenoid 503, a stable magnetic field is achieved by constructing the solenoid coil mandrel from stable materials selected from the list including but not limited to Alumina, glass or Zirconia, and driving the coil 503 with a constant current generator formed by sinusoidal oscillator 501 and trans-admittance amplifier 502. The oscillator frequency is preferably selected to lie outside the measurement bandwidth desired for the current sensor. For example, an oscillator frequency of 1 kHz can be used for a current sensor designed to operate at nominally 60 Hz. The resulting DC or AC signal at the output of the individual magnetic field sensor 507 is sent to amplifier 504. The signal processor 505 converts the output of amplifier 504 into an error voltage. If the additional magnetic field is a DC field, then the signal processor 504 is an adjustable attenuator or amplifier. If the additional magnetic field is an AC field, then the signal processor 504 is comprised of an adjustable attenuator and amplifier fed by a synchronous detector that generates an error voltage. The synchronous detector performs the function of a narrowband filter, generating an output voltage that is proportional to the root-mean-squared amplitude of the AC signal generated by magnetic field sensor 507 at the modulation frequency of the signal source 501. The error voltage is used to control a voltage regulator 301 that generates the power supply voltage for all of the magnetic field sensors. In this way, the output signal of one sensor due to the stable extra magnetic field is used to compensate the sensitivity of all of the magnetic field sensors as the ambient temperature is varied. Note that this will result in an extra signal being created at the output of the complete current sensor. For the solenoid approach, this can be substantially removed by subtracting the voltage 506 from the current sensor output that is proportional to the extra magnetic field generated by the solenoid. When using a permanent magnet, the signal 506 is a DC voltage that removes the offset voltage generated by magnetic field sensor 507.

Figure 6A:
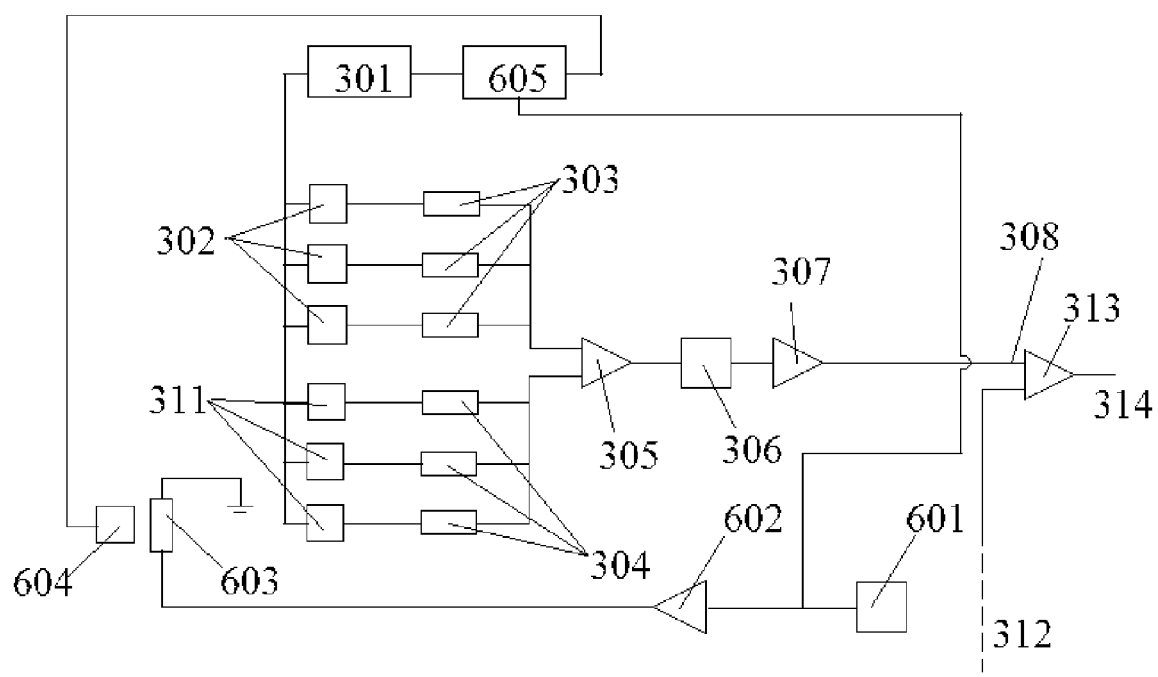
FIG. 6A is a schematic diagram of the temperature compensation circuit using an electromagnet to generate a signal in a separate magnetic field sensor to adjust the reference voltage.
Figure 6B:
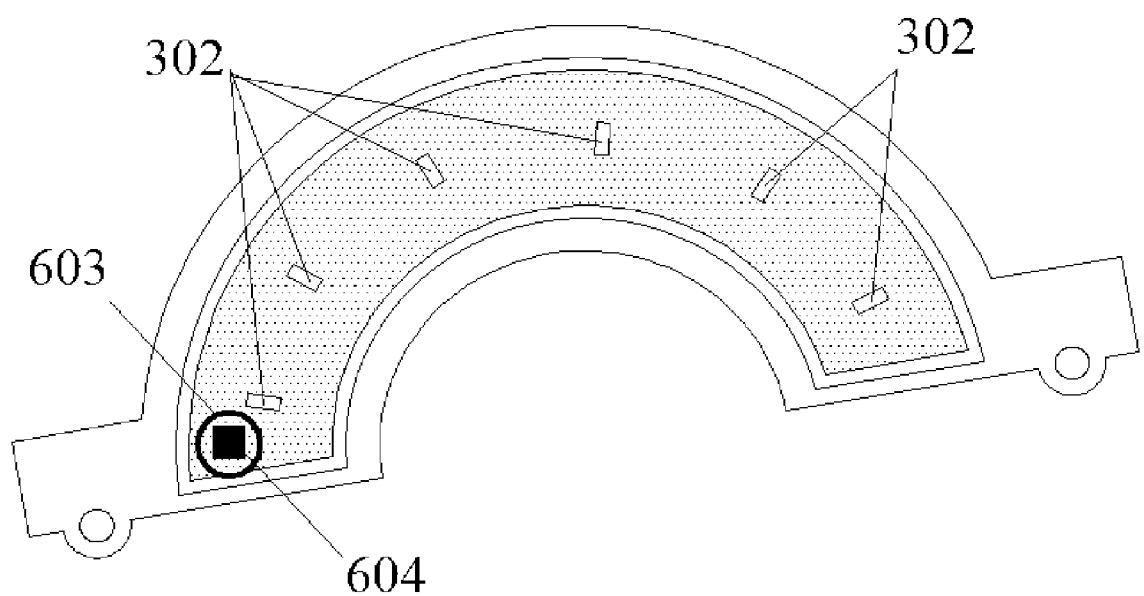
FIG. 6B is a drawing of one half of the current sensor, showing the location of the electromagnet or permanent magnet on the printed circuit board.
Figure 6C:
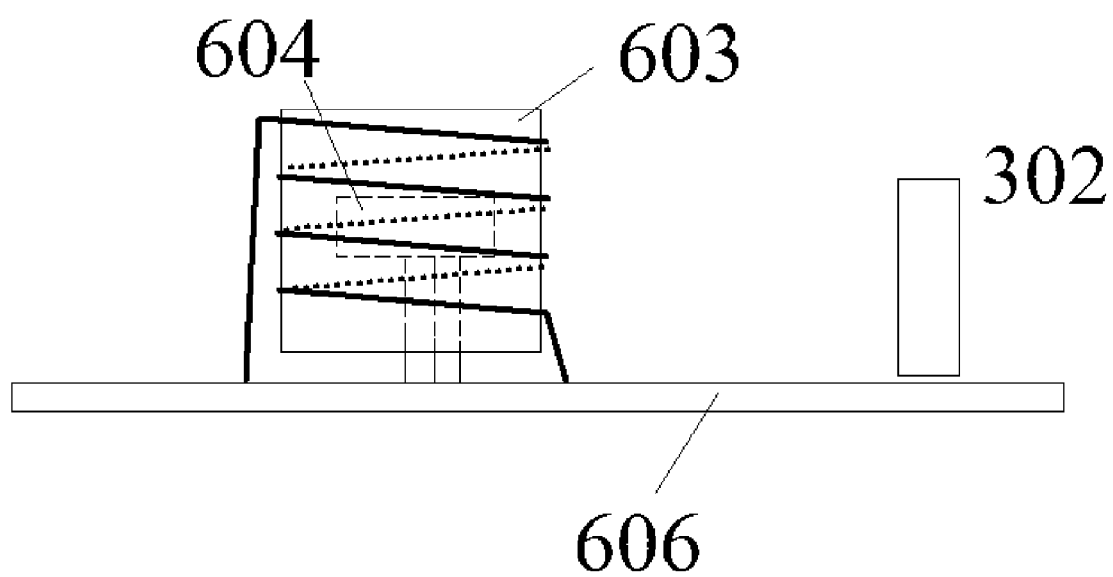
FIG. 6C is a drawing showing the side view of the solenoid coil and the magnetic field sensor used for compensation.

In a fourth embodiment of temperature compensation shown in FIGS. 6A, 6B and 6C, a separate magnetic field sensor 604 is placed inside of a stable solenoid coil 603 that is in turn driven by a constant current generator. The magnetic field generated by the solenoid coil 603 is an AC field. The solenoid coil 603 and the magnetic field sensor 604 are oriented in such a way that the direction of the generated and detected magnetic field is substantially perpendicular to the sensitivity axis of the magnetic field sensors 302 already present on the printed circuit board 606. The magnetic field sensor 604 should be selected to have a temperature dependence that is substantially the same as the average temperature dependence of the entire array of magnetic field sensors. The magnitude of the extra magnetic field in the region surrounding the magnetic field sensor 604 is kept as stable as possible. For the solenoid 603, a stable magnetic field is achieved by constructing the solenoid coil mandrel from stable materials selected from the list including but not limited to Alumina, glass or Zirconia, and driving the coil 603 with a constant current generator formed by sinusoidal oscillator 601 and trans-admittance amplifier 602. The oscillator frequency is preferably selected to lie outside the measurement bandwidth desired for the current sensor. For example, an oscillator frequency of 1 kHz can be used for a current sensor designed to operate at nominally 60 Hz.

The resulting AC signal at the output of the individual magnetic field sensor 604 is sent to signal processor 605 that converts the output of the magnetic field sensor 604 into an error voltage. The signal processor 605 is comprised of an adjustable attenuator and amplifier fed by a synchronous detector. The synchronous detector performs the function of a narrowband filter, generating an output voltage that is proportional to the amplitude of the AC signal generated by magnetic field sensor 604 at the modulation frequency of the signal source 601. The error voltage is used to control a voltage regulator 301 that generates the power supply voltage for the magnetic field sensors 302 and 604. In this way, the output signal of one sensor due to the stable extra magnetic field is used to compensate the sensitivity of all of the magnetic field sensors as the ambient temperature is varied. Note that this will not result in an extra signal being created at the output of the complete current sensor, which simplifies the technique as compared with the approach described in FIG. 5.

Figure 7A:
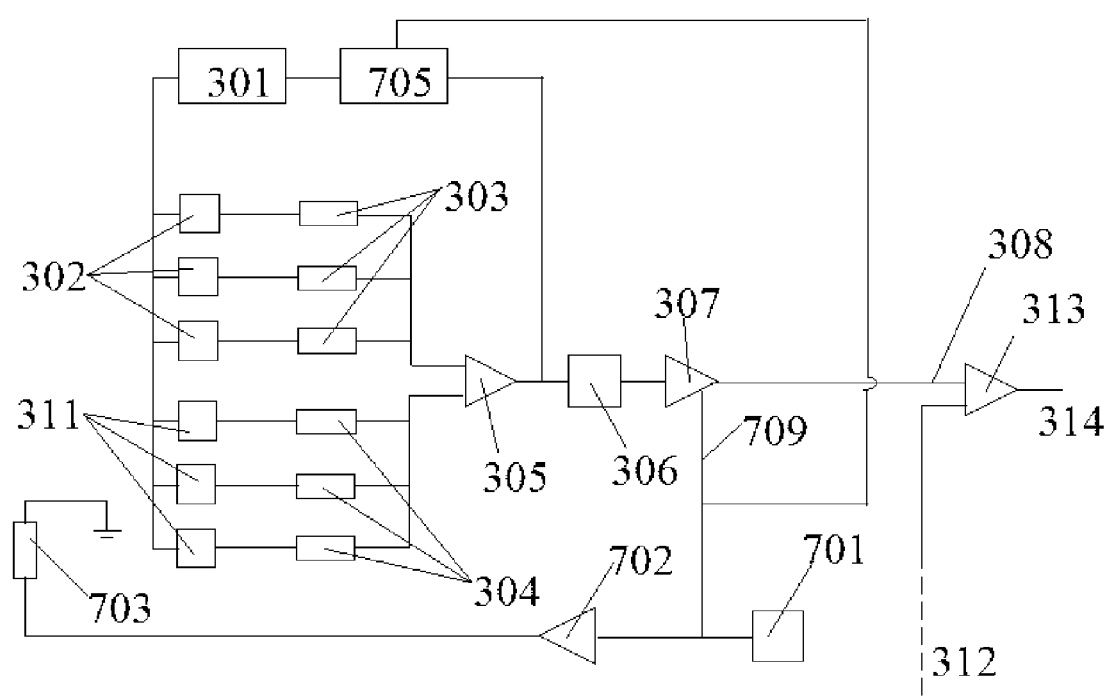
FIG. 7A is a schematic diagram of the temperature compensation circuit using a separate conductor carrying a known current that is detected by the array of magnetic field sensors to generate a signal that adjusts the reference voltage.
Figure 7B:
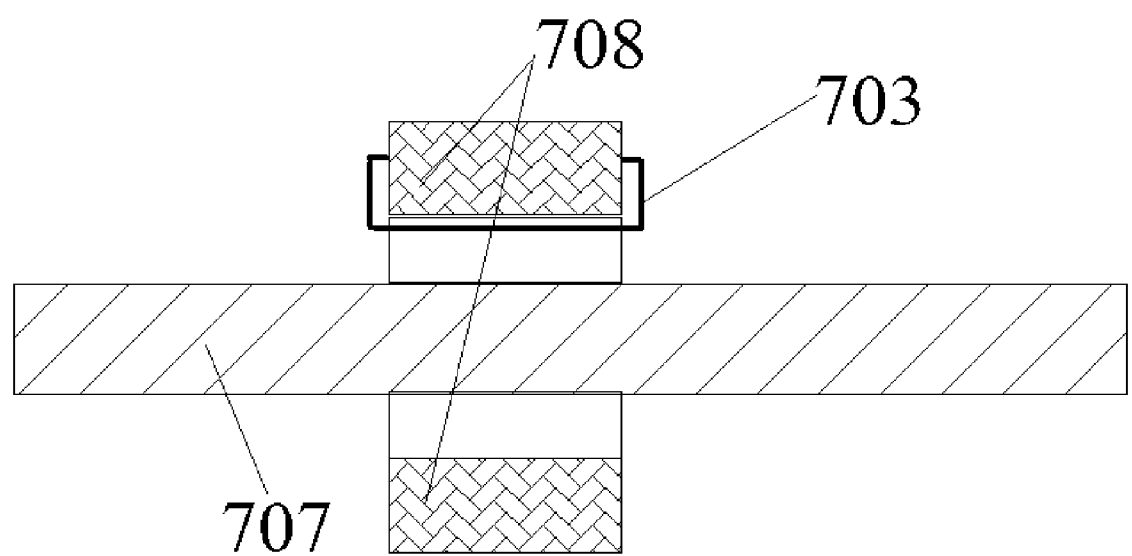
FIG. 7B is a drawing showing the side cross section of the current sensor encircling the conductor, with the secondary conductor position indicated.

In a fifth embodiment of temperature compensation shown in FIGS. 7A and 7B, a separate conductor 703 is located in the aperture of the current sensing device near the measured conductor 707. A precise calibration current is injected through this conductor by a sinusoidal oscillator 701 and trans-admittance amplifier 702 located in the sensor housing 708, preferably at a frequency that is well separated from frequencies occurring in the main current carrying conductor. The sensor array detects the calibration signal as well as the main signal in the main conductor. A preferred frequency for this signal is >1 kHz, or low frequencies such as quasi-DC where the current switches polarity every few seconds. The resulting AC signal at the output of the difference amplifier 305 is sent to signal processor 705 that generates an error voltage. The signal processor 705 is comprised of an adjustable attenuator and amplifier fed by a synchronous detector that generates an error voltage. The synchronous detector performs the function of a narrowband filter, generating an output voltage that is proportional to the amplitude of the AC current flowing in conductor 703 at the modulation frequency of the signal source 701, and excluding any signals at other frequencies. The error voltage is used to control a voltage regulator 301 that generates the power supply voltage for all of the magnetic field sensors. In this way, the output signal from the sensor array due to the stable extra current passing through the sensor aperture is used to compensate the sensitivity of all of the magnetic field sensors as the ambient temperature is varied. Note that this will result in an extra signal being created at the output of the complete current sensor. This can be substantially removed by subtracting a voltage 709 from the current sensor output that is proportional to the extra current flowing in the conductor 703.

Figure 8:
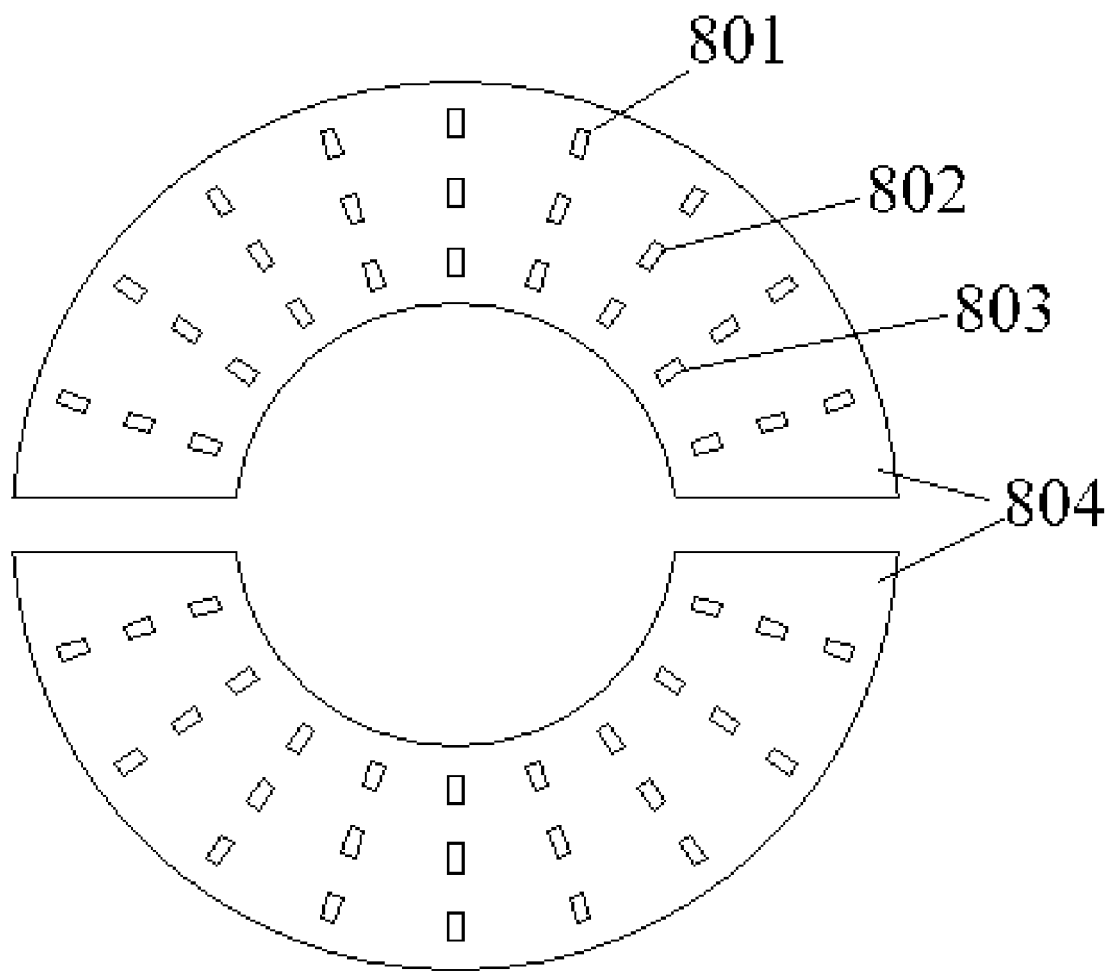
FIG. 8 is a schematic drawing of the use of multiple arrays of magnetic field sensors to provide different sensitivities to the measured current.

More than one set of sensors can be placed along a curve that encircles a current carrying conductor. As an example shown in FIG. 8, three sets of magnetic field sensors 801, 802 and 803 are placed along curves at three different radii from the center of the current sensor, forming three separate sensor arrays on printed circuit boards 804. Since the magnetic field generated by the current carrying conductor varies inversely with the distance from the center of the current carrying conductor, the three sets of magnetic field sensors will produce output signals having three different ratios. Different sensor sensitivities and different amplifier gains used for each array 801, 802 or 803 can further provide adjustability of the ratio of each array's output signal. This is a useful feature when a current sensor is required to meet metering accuracy of 0.3% over a range of 10 Amps to 1000 Amps, as well as provide accurate representations of the current when fault currents occur that can have peak values as high as 100,000 Amps.

Figure 9:
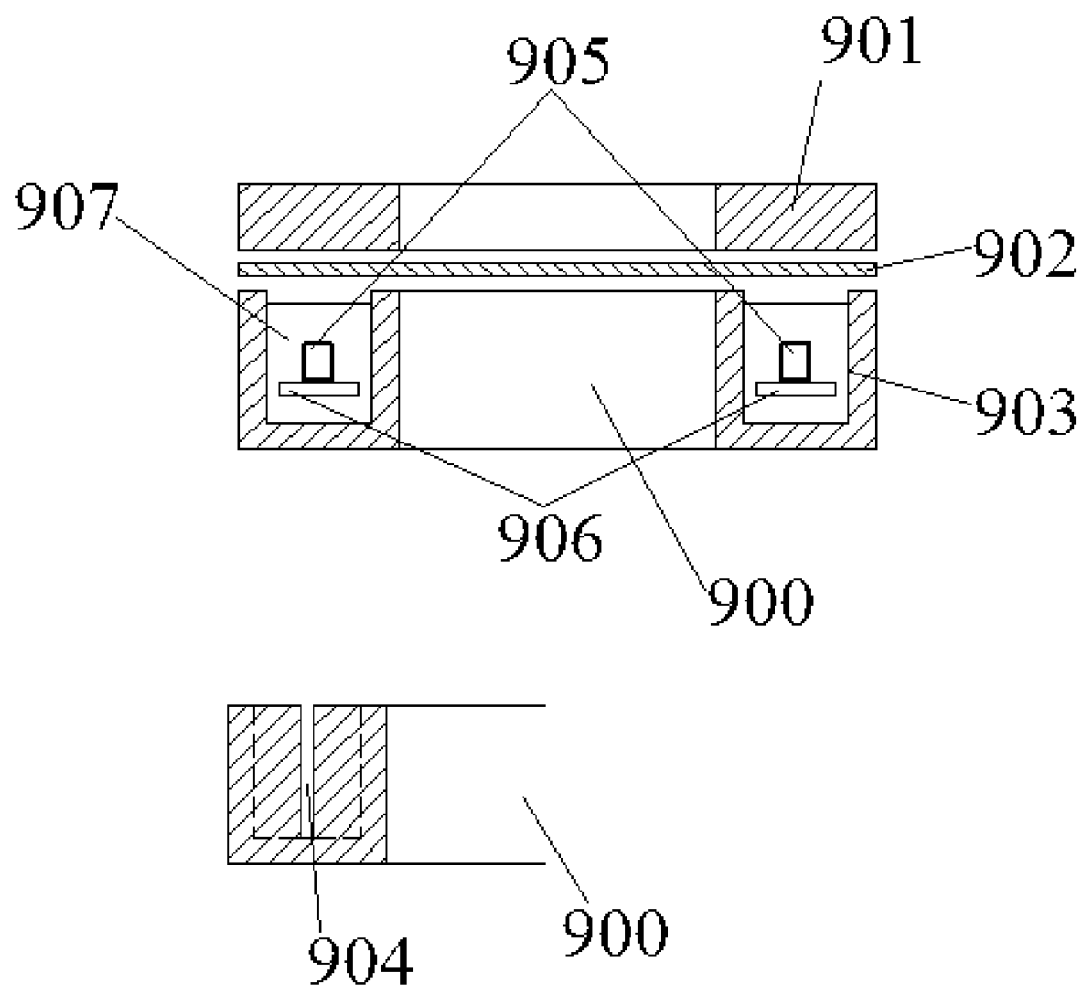
FIG. 9 is a cross-sectional view of the housing showing the trough used to contain the printed circuit board.

As shown in the cross-section in FIG. 9, the current sensor housing consists of a plate with a trough 903. The printed circuit board 906 carrying the magnetic field sensors 905 and other associated circuitry is mounted into the trough and preferably potted in a flexible compound 907 selected from the list including but not limited to silicone, epoxy, acrylonitrile butadiene styrene (ABS) and polyurethane. A top lid 901 is fastened to the lower assembly with bolts or other suitable fastening means, interposed between which is a sealing and insulating gasket 902 fabricated from a material selected from the list including but not limited to EPDM rubber, silicone and Viton rubber. The potting and gasket form a hermetic seal to protect the printed circuit board 906 from the outside environment.

The housing is preferably fabricated from a metal, but it can be fabricated from an insulating material provided that metallic shielding is placed around the printed circuit boards 906 to provide Faraday shielding of the electronic circuitry from external electric fields. The use of a poor electrically conductive material such as bismuth, stainless steel, carbon-filled polymer or metal/carbon filled epoxy prevents substantial eddy currents from being generated, which can cause measurement errors in both ratio magnitude and phase angle. However, for these materials the Faraday shielding of the printed wiring board is reduced compared with that provided by highly conductive metals such as copper or aluminum.

The use of Aluminum as a housing material provides the added benefit that eddy currents induced in the housing by the magnetic field generated by the current carrying conductor can be exploited to homogenize the magnetic field distribution near the magnetic field sensors. As shown in FIG. 9, an aluminum top plate is secured to the bottom plate with a means that minimizes the creation of closed current paths that encircle the printed circuit board. This can be achieved by using electrically insulating fasteners and an electrically insulating gasket material 902 between the top and bottom plates. When measuring currents, the magnetic field generated by the current carrying conductor is homogenized by eddy currents induced in the sides, top and bottom of the trough containing the printed circuit board, resulting in improved immunity to errors induced by external magnetic fields, external materials with high magnetic permeability, and rotation or translation of the current sensing device.

Moreover, eddy currents can be deleterious to device operation when they encircle the path along which the magnetic field sensors are located. To minimize this effect, the ends of each plate with trough 900 shown in FIG. 9 are fabricated to reduce the effects of eddy currents on the ratio accuracy and phase angle of the current measuring device. The ends of each plate with trough 900 can be modified to have no material present, or they can be modified with a thin slot 904 to prevent eddy current paths from encircling the path along which the sensors are located. In either case, the open end of each plate with trough 900 is then filled with an electrically insulating potting compound to form a hermetically sealed surface.

An example of a current sensor is given below. A total of eight Hall effect magnetic field sensors with matched sensitivities to magnetic fields are placed on each printed circuit board. Four sensors have positive orientation, and four sensors have negative orientation. The outputs of the sensors are averaged and differenced, and the two printed circuit board outputs are summed to generate an output voltage. The output voltage is phase shifted with a passive filter circuit. The magnetic field sensors are temperature compensated using the method shown in FIG. 3. The resulting current sensor has an aperture opening of 2.5 inches, and a sensitivity of 2 volts per kiloamp. The ratio is linear to within 0.1% of reading from 10 Amps to 1500 Amps (AC rms), and has a noise floor of 1 Amp rms with a bandwidth of DC −5 kHz. The output phase angle is stable to within +/−5 minutes over all test conditions. The ratio error is +/−0.3% over a temperature range of −40 to +85 degrees Celcius. Repeated opening and closing of the clamping mechanism results in ratio errors of <0.05%. Rotating the current sensor around the current carrying conductor results in errors of <0.1%. Tilting the current sensor relative to the current carrying conductor by +/−30 degrees results in ratio errors of <0.3%. The ratio error varies by <0.2% as the conductor is moved anywhere within the sensor's aperture. Varying the size of the conductor from 1 inch to 2 inch diameter results in ratio errors of <0.05%. When the current sensor is closed, and placed next to (in contact with) a conductor carrying 1000 Amps, the resulting signal level is <0.1 Amp of induced signal, resulting in a rejection ratio of >80 dB for currents that do not pass through the current sensor aperture.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method to compensate for the temperature dependence and calibration drift of a current sensor comprised of a plurality of magnetic field sensors positioned around a current carrying conductor, the outputs of which are electronically combined to produce a signal representing the current flowing in said electrical conductor, where the sensitivity to magnetic fields of each sensor is proportional to the voltage of the power source that is applied to each sensor, comprising the steps of selecting a first magnetic field sensor from the plurality of magnetic field sensors having a temperature dependence of sensitivity to magnetic fields that is substantially the same as the temperature dependence of sensitivity for the plurality of magnetic field sensors, positioning a solenoidal coil proximate to first magnetic field sensor, exciting the solenoidal coil with a known electrical current, electronically processing first magnetic field sensor signal to generate an error signal that is proportional to the magnetic field created by the solenoidal coil while rejecting signals generated by other magnetic fields, and using the error signal to control a voltage regulator that generates the power source for the plurality of magnetic field sensors.

2. The method in claim 1 where the magnetic field sensors are selected from the list including but not limited to Hall effect, magnetoresistive, giant magnetoresistive and magnetostrictive sensors.

3. The method in claim 1 where electronically processing first magnetic field sensor signal is comprised of a synchronous electronic detector.

4. A device for measuring electric current comprised of a plurality of magnetic field sensors positioned around a current carrying conductor, the outputs of which are electronically combined to produce a signal representing the current flowing in said electrical conductor, where each sensor is sensitive to one vector component of the magnetic field generated by the electric current, where the sensors are positioned along one or more continuous closed paths encircling the conductor, where the sensors have substantially identical sensitivity along each closed path, where the sensors are equally spaced along the length of each closed path, where the vector direction of sensitivity for each sensor is oriented to be tangential with the closed path at each sensor location, where the sensitivity to magnetic fields of each sensor is proportional to the voltage of the power source that is applied to each sensor, where a first magnetic field sensor selected from the plurality of magnetic field sensors has a temperature dependence of sensitivity to magnetic fields that is substantially the same as the temperature dependence of sensitivity for the plurality of magnetic field sensors, where a solenoidal coil is positioned proximate to first magnetic field sensor, where the solenoidal coil is excited with a known electrical current, where first magnetic field sensor signal is electronically processed to generate an error signal that is proportional to the magnetic field created by the solenoidal coil while rejecting signals generated by other magnetic fields, and where the error signal is used to control a voltage regulator that generates the power source for the plurality of magnetic field sensors.

5. The device in claim 4 where the magnetic field sensors are selected from the list including but not limited to Hall effect, magnetoresistive, giant magnetoresistive and magnetostrictive sensors.

6. The device in claim 4 where electronically processing first magnetic field sensor signal is comprised of a synchronous electronic detector.

7. A method to compensate for the temperature dependence and calibration drift of a current sensor comprised of a plurality of magnetic field sensors positioned around a current carrying conductor, the outputs of which are electronically combined to produce a signal representing the current flowing in said electrical conductor, where the sensitivity to magnetic fields of each sensor is proportional to the voltage of the power source that is applied to each sensor, comprising the steps of selecting a first magnetic field sensor from the plurality of magnetic field sensors having a temperature dependence of sensitivity to magnetic fields that is substantially the same as the temperature dependence of sensitivity for the plurality of magnetic field sensors, positioning a permanent magnet proximate to first magnetic field sensor, electronically processing first magnetic field sensor signal to generate an error signal that is proportional to the magnetic field created by the permanent magnet while rejecting signals generated by other magnetic fields, and using the error signal to control a voltage regulator that generates the power source for the plurality of magnetic field sensors.

8. The method in claim 7 where the magnetic field sensors are selected from the list including but not limited to Hall effect, magnetoresistive, giant magnetoresistive and magnetostrictive sensors.

9. The method in claim 7 where electronically processing first magnetic field sensor signal is comprised of a synchronous electronic detector.

10. A device for measuring electric current comprised of a plurality of magnetic field sensors positioned around a current carrying conductor, the outputs of which are electronically combined to produce a signal representing the current flowing in said electrical conductor, where each sensor is sensitive to one vector component of the magnetic field generated by the electric current, where the sensors are positioned along one or more continuous closed paths encircling the conductor, where the sensors have substantially identical sensitivity along each closed path, where the sensors are equally spaced along the length of each closed path, where the vector direction of sensitivity for each sensor is oriented to be tangential with the closed path at each sensor location, where the sensitivity to magnetic fields of each sensor is proportional to the voltage of the power source that is applied to each sensor, where a first magnetic field sensor selected from the plurality of magnetic field sensors has a temperature dependence of sensitivity to magnetic fields that is substantially the same as the temperature dependence of sensitivity for the plurality of magnetic field sensors, where a permanent magnet is positioned proximate to first magnetic field sensor, where first magnetic field sensor signal is electronically processed to generate an error signal that is proportional to the magnetic field created by the permanent magnet while rejecting signals generated by other magnetic fields, and where the error signal is used to control a voltage regulator that generates the power source for the plurality of magnetic field sensors.

11. The device in claim 10 where the magnetic field sensors are selected from the list including but not limited to Hall effect, magnetoresistive, giant magnetoresistive and magnetostrictive sensors.

12. The device in claim 10 where electronically processing first magnetic field sensor signal is comprised of a synchronous electronic detector.

* * * * *